United States Patent
Yoshimoto et al.

(10) Patent No.: US 8,663,808 B2
(45) Date of Patent: Mar. 4, 2014

(54) FLEXOGRAPHIC PRINTING ORIGINAL PLATE

(75) Inventors: Kazuya Yoshimoto, Okayama (JP);
Tetsuma Kawakami, Okayama (JP);
Yukimi Yawata, Okayama (JP)

(73) Assignee: Toyo Boseki Kabushiki Kaisha, Osaka-shi, Osaka (JP)

( * ) Notice: Subject to any disclaimer, the term of this patent is extended or adjusted under 35 U.S.C. 154(b) by 106 days.

(21) Appl. No.: 13/379,846

(22) PCT Filed: Jul. 26, 2010

(86) PCT No.: PCT/JP2010/062493
§ 371 (c)(1),
(2), (4) Date: Dec. 21, 2011

(87) PCT Pub. No.: WO2011/013601
PCT Pub. Date: Feb. 3, 2011

(65) Prior Publication Data
US 2012/0156514 A1    Jun. 21, 2012

(30) Foreign Application Priority Data
Jul. 30, 2009    (JP) ................................. 2009-177705

(51) Int. Cl.
*B32B 27/00*    (2006.01)
*G03C 1/00*    (2006.01)

(52) U.S. Cl.
USPC ....................................... 428/500; 430/270.1

(58) Field of Classification Search
None
See application file for complete search history.

(56) References Cited

U.S. PATENT DOCUMENTS

| | | | |
|---|---|---|---|
| 5,077,175 A | 12/1991 | Fryd et al. | |
| 6,054,249 A | 4/2000 | Nagahara et al. | |
| 2004/0234886 A1 | 11/2004 | Rudolph et al. | |
| 2006/0008729 A1 | 1/2006 | Ichikawa et al. | |
| 2007/0117039 A1* | 5/2007 | Wada et al. | 430/270.1 |
| 2008/0305407 A1* | 12/2008 | Zwadlo et al. | 430/5 |

FOREIGN PATENT DOCUMENTS

| | | |
|---|---|---|
| JP | 2-113254 A | 4/1990 |
| JP | 3-198058 A | 8/1991 |
| JP | 4-130325 A | 5/1992 |
| JP | 7-506201 A | 7/1995 |
| JP | 8-305030 A | 11/1996 |
| JP | 10-039513 A | 2/1998 |
| JP | 2000-214594 A | 8/2000 |
| JP | 2004-163925 A | 6/2004 |
| JP | 2004-302447 A | 10/2004 |
| JP | 2006-003706 A | 1/2006 |
| JP | 2007-086152 A | 4/2007 |
| JP | 2009-139599 A | 6/2009 |
| WO | 94/03838 A1 | 2/1994 |
| WO | 2004/090638 A1 | 10/2004 |
| WO | 2009/141930 A1 | 11/2009 |

OTHER PUBLICATIONS

International Search Report of PCT/JP2010/062493, mailing date Aug. 17, 2010.

* cited by examiner

*Primary Examiner* — Sheeba Ahmed
(74) *Attorney, Agent, or Firm* — Westerman, Hattori, Daniels & Adrian, LLP

(57) ABSTRACT

The present invention provides a flexographic printing original plate having no wrinkle on the plate surface and having no plate surface abnormality due to laser in spite of the fact that it is a flexible water-developable plate. A photosensitive flexographic printing original plate developable by water in which at least a supporting member, a photosensitive resin layer, a protective layer and a heat-sensitive mask layer are successively laminated, characterized in that, the protective layer contains (A) polyvinyl alcohol, (B) plasticizer and (C) water-dispersible latex in the following rate.

Polyvinyl alcohol (A): 25 to 80 parts by weight
Plasticizer (B): 15 to 60 parts by weight
Water-dispersible latex (C): 5 to 40 parts by weight.

4 Claims, No Drawings

FLEXOGRAPHIC PRINTING ORIGINAL PLATE

TECHNICAL FIELD OF THE INVENTION

The present invention relates to a flexographic printing original plate to be used for producing a flexographic printing plate according to a Computer to Plate Technique, and in particular, it concerns a flexographic printing original plate which gives a printing plate having no wrinkle on the plate surface and having no plate surface abnormality due to laser.

BACKGROUND ART

In recent years, in the field of flexographic printing, a Computer to Plate Technique (CTP Technique), known as a digital image-forming technique, has been widely used as a general technique. The CTP technique is a method in which information processed on a computer is directly outputted onto a printing plate so that a concave/convex pattern to form a relief is obtained. This technique eliminates the necessity of negative film producing processes, thereby making it possible to reduce costs and time required for forming the negative film.

In the CTP technique, the negative film for covering areas that should not be polymerized by exposure is replaced by a mask that is formed within a printing plate.

Also, in Patent Document 1, a method has been proposed where an infrared sensitive layer that is opaque to chemical rays is formed on a photosensitive resin layer and by evaporating this infrared sensitive layer by using an infrared laser, an image mask is formed. This photosensitive printing original plate is constituted from photosensitive resin layer, protective layer and infrared sensitive layer. The protective layer has a function of preventing the mass transfer between the photosensitive resin layer and the infrared-sensitive layer and of preventing the polymerization inhibition of the photosensitive resin layer due to oxygen in the air.

On the other hand, as to the photosensitive resin layer, that which is developable by an aqueous type solution has been strongly demanded in view of affection to the environment and of workability. As to the flexographic photosensitive resin layer developable by water, that comprising synthetic rubber and hydrophilic polymer has been put into the market (cf. Patent Document 2). Moreover, in recent years, there has been developed a water-developable plate where resolution is further enhanced by the use of latex which is present in fine particles as a main component (cf. Patent Document 3).

However, when the photosensitive resin layer as such which is developable by water is used as a photosensitive layer for CTP plate, there is a problem that wrinkles are generated on the plate surface since the flexibility of the photosensitive resin is high. The wrinkles are generated when the plate is detached to return to the flat plane after the plate is attached to a drum in a laser processing. The above problem is particularly significant when a photosensitive resin layer comprising the latex as a main component is used. It is presumably because the latex is present in fine particles whereby the plate is more flexible.

As to a method for preventing the wrinkles on the plate, there has been proposed a method where a protective layer on the photosensitive resin layer is omitted so that the photosensitive resin layer directly contacts with the heat-sensitive mask layer (cf. Patent Document 4). However, when this method is applied to a water-developable plate comprising the latex as a main component, the polymerization inhibition of the photosensitive resin layer due to oxygen in the air is vigorous and satisfactory plate is never achieved. There is also proposed a method where the elastic modulus of the protective layer on the photosensitive resin layer is lowered (cf. Patent Document 5). In this method, large amount of plasticizer is compounded with the protective layer to lower the elastic modulus. Although this method is effective for the prevention of wrinkles, heat resistance of the protective layer lowers by compounding with large amount of the plasticizer, and the protective layer is damaged by the heat upon laser ablation. Therefore, there is a tendency that the plate surface abnormality such as concaves or scanning lines is apt to be generated. As such, it is the current status that no completely satisfactory plate has been achieved in a water-developable CTP plate or, particularly, a water-developable CTP plate comprising the latex as a main component.

PRIOR ART DOCUMENTS

Patent Documents

Patent Document 1: Japanese Patent Application Laid-Open (JP-A) No. 506201/95
Patent Document 2: Japanese Patent Application Laid-Open (JP-A) No. 198058/91
Patent Document 3: WO 2004/090638
Patent Document 4: Japanese Patent Application Laid-Open (JP-A) No. 305030/96
Patent Document 5: Japanese Patent Application Laid-Open (JP-A) No. 2006-3706

DISCLOSURE OF THE INVENTION

Problem that the Invention is to Solve

The present invention has been created in view of the current status of the conventional art and its object is to provide a flexographic printing original plate having no wrinkle on the plate surface and having no plate surface abnormality due to laser in spite of the fact that it is a flexible water-developable plate.

Means for Solving the Problem

In order to achieve such an object, the present inventors have carried out the investigations intensively and found that the above problem can be solved by the use of a photosensitive flexographic printing original plate developable by water in which at least a supporting member, a photosensitive resin layer, a protective layer and a heat-sensitive mask layer are successively laminated, characterized in that, the protective layer contains (A) polyvinyl alcohol, (B) plasticizer and (C) water-dispersible latex in the following rate.
  Polyvinyl alcohol (A): 25 to 80 parts by weight
  Plasticizer (B): 15 to 60 parts by weight
  Water-dispersible latex (C): 5 to 40 parts by weight
In accordance with the preferred embodiment of the present invention, the plasticizer (B) is a polyether-polyol compound. In accordance with the further preferred embodiment of the present invention, the plasticizer (B) has three or more hydroxyl groups in a molecule and has a molecular weight of 200 or more.

Advantages of the Invention

In the flexographic printing original plate of the present invention, its protective layer contains (A) polyvinyl alcohol, (B) plasticizer and (C) water-dispersible latex in a predetermined rate whereby it can prevent the polymerization inhibition due to oxygen in a photosensitive layer, has no wrinkle on the plate surface and is resistant to heat which is generated by ablation of the heat-sensitive mask layer. Therefore, the present invention can give an excellent printing plate having no wrinkle on the plate surface and having no plate surface abnormality such as concaves or scanning lines due to laser in spite of the fact that it is a flexible water-developable plate.

Best Mode for Carrying Out the Invention

The flexographic printing original plate of the present invention will now be illustrated in detail as follows.

The photosensitive flexographic printing original plate of the present invention has a constitution in which at least (P) a supporting member, (Q) a photosensitive resin layer, (R) a protective layer and (S) a heat-sensitive mask layer are successively laminated.

The supporting member (P) to be used for the original plate of the present invention is preferably made from a material being flexible and having a superior dimension stability, and examples thereof include: a supporting member made of metal, such as steel, aluminum, copper and nickel, and a supporting member made of a thermoplastic resin, such as a polyethylene terephthalate film, a polyethylene naphthalate film, a polybutylene terephthalate film and a polycarbonate film. Among these, the polyethylene terephthalate film, which has a superior dimension stability and a sufficiently high viscoelasticity, is in particular preferably used. The thickness of the supporting member is set to 50 to 350 µm, preferably, to 100 to 250 µm, from the viewpoints of mechanical properties, shape stability and handling characteristics upon producing a printing plate. Moreover, if necessary, in order to improve an adhesive property between the supporting member and a photosensitive resin layer, an adhesive may be formed between them.

The photosensitive resin layer (Q) to be used for the original plate of the present invention is preferably composed of essential components, such as a synthetic polymer compound, a photopolymerizable unsaturated compound and a photopolymerization initiator, and desirable additives, such as a plasticizer, a thermal polymerization inhibitor, a dye, a pigment, an ultraviolet-ray absorbing agent, perfume, and an antioxidant. In the present invention, the photosensitive resin layer (Q) must be the one which is developable by using a water-based developer. Latex is preferably used as the synthetic polymer compound that is developable by water. Although the photosensitive resin layer developable by water is usually flexible, the raw plate inevitably becomes very flexible when latex is used. When latex is not used, the thing which is mentioned, for example, in Japanese Laid-Open Patent No. 198058/91 may be used.

Examples of the latex that are applicable to the photosensitive resin layer (Q) of the present invention include: water-dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex, and polymers obtained by copolymerizing another component, such as acrylic acid and methacrylic acid, therewith. Among these, water-dispersible latex polymers having a butadiene structure or an isoprene structure in molecular chains are preferably used from the viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The latex needs to be designed so that its existence is confirmed as independent fine particles.

The protective layer (R) used for the original plate of the present invention is provided for preventing the polymerization inhibition of the photosensitive resin layer (Q) due to oxygen. The protective layer (R) contains at least three components which are (A) polyvinyl alcohol, (B) plasticizer and (C) water-dispersible latex in the following rate.

Polyvinyl alcohol (A): 25 to 80 parts by weight
Plasticizer (B): 15 to 60 parts by weight
Water-dispersible latex (C): 5 to 40 parts by weight Polyvinyl alcohol (A) is used for giving an oxygen barrier property to the protective layer (R). Compounding amount of polyvinyl alcohol is 25 to 80 parts by weight. It is preferably 35 to 70 parts by weight. When it is less than 25 parts by weight, oxygen barrier property of the protective layer (R) is insufficient and the surface of the photosensitive resin layer (Q) becomes rough due to oxygen inhibition. On the contrary, when it is more than 80 parts by weight, elastic modulus of the protective layer (R) becomes high and wrinkles are generated on the plate surface.

Any polyvinyl alcohol (A) may be used so far as its degree of saponification is not less than 50%. Preferred degree of saponification of polyvinyl alcohol is 60% to 90%. When the degree of saponification is less than 60%, oxygen barrier property of the protective layer (R) is insufficient while, when it is more than 90%, elastic modulus of the protective layer (R) becomes high and wrinkles on the plate surface are apt to be generated. Incidentally, a modified substance such as carboxyl group-modified polyvinyl alcohol or silane-modified polyvinyl alcohol can also be used.

The plasticizer (B) is compounded for lowering the elastic modulus of the protective layer (R) and to prevent the generation of wrinkles on the plate surface. The wrinkles are generated due to such a reason that, when the protective layer (R) which has been spread by winding around a drum is returned to a plane, spread area of the protective layer (R) sinks into the photosensitive resin layer (Q). Since the photosensitive resin layer surface of the water-developable plate is very flexible, wrinkles are particularly apt to be generated thereon. When elastic modulus of the protective layer (R) is lowered, its sinking into the photosensitive resin can be reduced and generation of the wrinkles can be suppressed.

Compounding amount of the plasticizer (B) is 15 to 60 parts by weight and preferably 20 to 50 parts by weight. When the compounding amount is less than 15 parts by weight, lowering of the elastic modulus of the protective layer (R) is insufficient and wrinkles are generated on the plate surface. On the other hand, when the compounding amount is more than 60 parts by weight, lowering in the heat resistance of the protective layer and bleeding-out of the plasticizer are resulted. When the heat resistance of the protective layer lowers, the protective layer is damaged by the heat generated by ablation of the heat-sensitive mask layer and, in that area, plate surface abnormality is resulted.

With regard to the plasticizer (B), that which is compatible with polyvinyl alcohol and lowers the elastic modulus is preferred. Specific examples thereof include ethylene glycol, trimethylene glycol, tetramethylene pentamethylene glycol, hexamethylene glycol, propylene glycol, glycerol, 2,3-butanediol, 1,3-butanediol, diethylene glycol and triethylene glycol as well as a compound where hydroxyl groups of the above-mentioned alcohol compound or polyhydric alcohol (such as sorbitol or hexane-1,2,3,4,5,6-hexaol) are substituted with one or more ethylene glycol group(s) such as hexane-1,2,3,4,5,6-hexaoxyethyleneol.

Preferred plasticizer (B) used in the present invention is polyether-polyol and/or a compound having three or more hydroxyl groups in a molecule. When a polyether-polyol compound is used, dependency of the plasticizer on the humidity lowers and affection by the environmental changes becomes small. On the other hand, when a compound having three or more hydroxyl groups in a molecule and having molecular weight of 200 or more is used, boiling point of the plasticizer rises and evaporation during a drying step is suppressed whereupon a stable property can be achieved. Examples of the plasticizer which satisfies both of them include a compound where hydroxyl group of polyhydric alcohol compound is substituted with ethylene glycol, diethylene glycol, polyethylene glycol, propylene glycol, polypropylene glycol or the like and a particularly preferred one is polyether-polyol of an aliphatic polyhydric alcohol.

Water-dispersible latex (C) is used for enhancing the heat resistance of the protective layer. As a result of compounding the water-dispersible latex (C), damage of the protective layer resulted by the heat generated upon ablation of the heat-sensitive mask layer can be reduced. This is presumably due to the fact that the water-dispersible latex (C) has higher thermal decomposition temperature and higher melt viscosity at high temperature compared with the polyvinyl alcohol and the plasticizer. Compounding amount of the water-dispersible latex (C) is 5 to 40 parts by weight and preferably 5 to 30 parts by weight. When the compounding amount is less than 5 parts by weight, improvement in the heat resistance of the protective layer (R) is insufficient while, when it is more than 40 parts by weight, a significant lowering in the oxygen barrier property of the protective layer (R) is resulted.

Any water-dispersible latex (C) may be used so far as it is uniformly miscible with a compounded solution of polyvinyl alcohol with the plasticizer. Examples thereof include water-dispersible latex polymers such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine polymer latex, butyl polymer latex, thiokol polymer latex and acrylate polymer latex, and polymers obtained by copolymerizing another component, such as acrylic acid and methacrylic acid, therewith.

With regard to an emulsification stabilizer (surfactant) to be used for the water-dispersible latex (C), an oligomer type is preferred in view of the miscibility with the compounded solution. Still more preferably, an alkali-soluble resin of acrylic type among the oligomer type is particularly preferred.

Layer thickness of the protective layer (R) is preferably 0.2 to 5.0 µm and more preferably 0.5 to 3.0 µm. When the thickness is less the above lower limit, oxygen barrier property is insufficient and there is a risk that roughness is resulted on the plate surface of the relief. When it is more than the above upper limit, wrinkles are apt to be generated and light scattering increases. Accordingly, that is not preferred.

In accordance with the present invention, protective layer is compounded with the three components which are (A) polyvinyl alcohol, (B) plasticizer and (C) water-dispersible latex whereupon the present inventors succeeded in the development of the printing original plate where the oxygen inhibition is prevented, wrinkles on the plate surface are not present and plate surface abnormality due to laser is not present. Up to now, there has been no example of the protective layer compounded with those three components and the present invention is very meaningful.

The heat-sensitive mask layer (S) to be used for the original plate of the present invention is composed of a binder and a material having a function for absorbing infrared laser rays to convert them into heat and a function for blocking ultraviolet rays. Moreover, desired components except for these, such as a pigment dispersant, a filler, a surfactant or a painting aid, may be contained therein within such a range as not to impair the effects of the present invention.

The heat-sensitive mask layer (S) is preferably designed to have an optical density of 2.0 or more, more preferably, an optical density of 2.0 to 3.0, and most preferably, an optical density of 2.2 to 2.5, relative to chemical rays.

The layer thickness of the heat-sensitive mask layer (S) is preferably set to 0.5 to 5.0 µm, more preferably, to 1.0 to 2.0 µm. When the layer thickness is set to the above-mentioned lower limit or more, it is possible to obtain an optical density of not less than a predetermined value, without the necessity of a high coating technique. Moreover, when the layer thickness is set to the above-mentioned upper limit or less, high energy is not required for evaporation of the heat-sensitive mask layer, which is advantageous from the viewpoint of costs.

Although there is no particular limitation for the above binder, a copolymerized polyamide having polarity is preferably used. The polyamide used may be appropriately selected from the conventionally known cationic polyamide, nonionic polyamide and anionic polyamide and examples thereof include polyamide which contains tertiary amine group, polyamide which contains quaternary ammonium salt group, polyamide which contains ether group and polyamide which contains sulfonic group.

Examples of the above material having an infrared ray absorbing function and an ultraviolet ray blocking function include dyes such as phthalocyanine, substituted phthalocyanine derivative, cyanine, merocyanine dye or polymethine dye and pigments such as carbon black, graphite, chromium oxide or iron oxide. Among them, carbon black is particularly preferred in view of light-heat converting rate, economy and handling property.

The above material having an infrared ray absorbing function and an ultraviolet ray blocking function is used appropriately in such a concentration that can achieve the above optical density and layer thickness. Usually, it is 1 to 60% by weight or, preferably, 10 to 50% by weight to the total weight of the heat-sensitive mask layer (S). When the amount is less than the lower limit, the optical density becomes less than 2.0 and there is a risk that neither infrared ray absorbing function nor ultraviolet ray blocking function is available. When the amount is more than the above upper limit, other component such as a binder becomes insufficient and there is a risk that the coat-forming property lowers.

It is preferable to provide a peelable flexible cover film on the heat-sensitive mask layer (S) to protect the printing original plate. Examples of the preferable peelable flexible cover film include a polyethylene terephthalate film, a polyethylene naphthalate film and a polybutylene terephthalate film. However, such a protective film is not absolutely necessary.

Although the method for manufacturing a flexographic printing original plate of the present invention is not particularly limited, it is generally manufactured by using the following processes.

First, all the components of the heat-sensitive mask layer are dissolved in an appropriate solvent to prepare a solution, or all the components except for pigments are dissolved in an appropriate solvent when pigments like carbon black is used, and pigments are then dispersed therein to prepare a dispersion solution. Next, this solution or dispersion solution is applied to a cover film (for example, a PET film) for a heat-sensitive mask layer, and the solvent is evaporated. Thereafter, protective layer components are applied thereon so that one of laminated bodies is formed. In the meantime, in a separated manner from this, a photosensitive resin layer is formed on a supporting member by a coating process so that the other laminated body is prepared. The two laminated bodies, thus obtained, are laminated under pressure and/or a heating process so that the photosensitive resin layer is arranged adjacent to the protective layer. Here, the cover film for the heat-sensitive mask layer functions as a surface protective film after completion of the printing original plate.

When the cover film is present, a method for manufacturing a printing plate from the printing original plate of the present invention includes processes in which, first, the cover film is removed from the photosensitive printing original plate. Thereafter, the heat-sensitive mask layer is imagewise-irradiated with an IR laser so that a mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, a diode laser system CDI Spark (manufactured by Esko-Graphics Co., Ltd.) and a semiconductor laser system Thermoflex (manufactured by Kodak Ltd.) may be used. This laser system includes a rotation cylinder drum used for holding a printing original plate, an IR laser irradiating device and a layout computer. Image information is directly transferred from the layout computer to the laser device.

After the image information has been written in the heat-sensitive mask layer, active light rays are applied onto the entire surface of the photosensitive printing original plate. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed so that a printing plate is obtained. The developing process can be carried out by using a commonly-used developing unit.

EXAMPLES

The present invention will now be specifically illustrated by way of the following Examples although the present invention is not limited thereto.

Referential Example

Preparation of Photosensitive Resin Composition Developable by Water 10 parts by weight of Acrylonitrile-butadiene latex (Nipol SX1503 containing 42% of non-volatile components; manufactured by Nippon Zeon), 58 parts by weight of butadiene latex (Nipol LX11INF containing 55% of non-volatile components; manufactured by Nippon Zeon), 28 parts by weight of oligobutadiene acrylate (ABU-2S manufactured by Kyoeisha Kagaku), 4 parts by weight of lauryl methacrylate (Light Ester L manufactured by Kyoeisha Kagaku), 4 parts by weight of dimethylol tricyclodecane diacrylate, 1 part by weight of photopolymerization initiator, 0.1 part by weight of hydroquinone monomethyl ether (as a polymerization inhibitor) and 0.1 part by weight of nonionic surfactant (as other additive) were mixed in a container together with 15 parts by weight of toluene and kneaded at 105° C. using a pressurizing kneader and, after that, toluene and water were removed therefrom in vacuo to give a photosensitive resin composition A. The stuffing displacement value of this composition A was measured and found to be 15 μm.

Referential Example

Preparation of Applying Solution for Heat-Sensitive Mask Layer

As an applying solution for heat-sensitive mask layer, a mixture of carbon black dispersion (manufactured by Orient Kogyo; AMBK-8) and copolymerized polyamide was used. Mixing ratio of the components in the mixture in a weight ratio in terms of solid is (carbon black):(dispersed resin):(copolymerized polyamide)=35:28:37.

Example 1

Preparation of Composition I for Protective Layer

Polyvinyl alcohol (PVA 405 manufactured by Kuraray; degree of saponification: 82%), plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol; solid concentration: 85%]) and NBR latex (SX 1503A manufactured by Nippon Zeon; solid concentration: 42%) were mixed in a ratio of 50/30/20 by weight to give a composition I for protective layer.

Preparation of Heat-Sensitive Mask Film

Both sides of a PET film (E5000 manufactured by Toyobo; thickness: 100 μm) were subjected to a releasing treatment and an applying solution for heat-sensitive mask layer of Referential Example was applied thereon using a bar coater #12 and dried at 120° C. for five minutes. The optical density at that time was 2.3. This optical density was measured by a white-and-black transmission densitometer DM-520 (manufactured by Dainippon Screen). After that, the above composition I for protective layer was applied thereon using a bar coater of a suitable type for giving thickness of 1.5 and dried at 120° C. for five minutes.

Flexographic Printing Original Plate

The photosensitive resin composition of Referential Example was aligned on a PET film supporting member (E5000 manufactured by Toyobo; thickness: 125 μm) on which an adhesive of a copolymerized polyester type was applied and a heat-sensitive mask film was layered thereon. The above was laminated at 100° C. using a heat press machine to give a flexographic printing original plate comprising PET supporting member, adhesive layer, photosensitive resin layer, protective layer, heat-sensitive mask layer and PET protective film subjected to a releasing treatment (cover film). Total thickness of the plate was 1.90 mm.

Manufacture of Printing Plate from Flexographic Printing Original Plate

First, chemical ray (light source: Philips 10R; illumination at 365 nm: 8 mW/cm$^2$) was irradiated for one minute from the PET supporting member side of the original plate in order to form a floor layer. After that, the PET film (cover film) subjected to a releasing treatment was peeled off therefrom. This plate was wound around a rotary drum of Thermoflex Narrow (manufactured by Kodak Ltd.) in such a manner that the heat-sensitive mask layer came on the surface side and evacuated followed by forming an image. After ablation, the plate was taken out and returned to a flat plane and chemical ray (light source: Philips 10R; illumination at 365 nm: 8 mW/cm$^2$) was irradiated thereon for six minutes. After that, development was carried out at 40° C. for eight minutes using a developing device (Stuck System) manufactured by A&V. Tap water to which 1% of Cascade (detergent for tableware manufactured by P&G, U.S.A.) was added was used as a developer. After developing, it was dried at 60° C. for ten minutes, chemical ray was irradiated thereon for ten minutes and, finally, a germicidal lamp was irradiated thereon for five minutes for removing the stickiness on the surface.

Performance Evaluations

Performances of each of the printing plates thus obtained were evaluated in the following manner.

Wrinkles: Wrinkles were evaluated by naked eye.
o: no wrinkle
x: with wrinkle

Roughness of the plate surface: The roughness of the plate surface was evaluated by naked eye.
o: no roughness on the plate surface
x: with roughness on the plate surface Damage due to laser: In the above "Manufacture of printing plate from flexographic printing original plate", that which was stored for 24 hours at the temperature of 20° C. and at the relative humidity of 50%, 80% or 90% was used as the printing original plate while other conditions were the same whereupon a printing plate was prepared. Surface of the resulting printing plate was observed by naked eye and the presence or absence of the damage due to laser was evaluated.

o: In any plate stored at the above relative humidity, no abnormality (concave an scanning line) was noted on the plate surface.

Δ: In the plate stored at the relative humidity of 80% and 90%, slight scanning line was noted but, in the plate stored at the relative humidity of 50%, there was no abnormality on the plate surface.

x: Abnormality on the plate surface was noted in the plate stored at any of the relative humidity Table 1 shows the results of these performance evaluations.

Example 2

Hereinafter, the same evaluations as in Example 1 were conducted using a composition II for protective layer.

Polyvinyl alcohol (PVA 405 manufactured by Kuraray; degree of saponification: 82%), plasticizer (glycerol) and NBR latex (SX 1503A manufactured by Nippon Zeon; solid concentration: 42%) were mixed in a ratio of 50/30/20 by weight to give a composition II for protective layer.

Example 3

Hereinafter, the same evaluations as in Example 1 were conducted using a composition III for protective layer.

Polyvinyl alcohol (PVA 405 manufactured by Kuraray; degree of saponification: 82%), plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol; solid concentration: 85%]) and NBR latex (SX 1503A manufactured by Nippon Zeon; solid concentration: 42%) were mixed in a ratio of 70/20/10 by weight to give a composition III for protective layer.

Example 4

Hereinafter, the same evaluations as in Example 1 were conducted using a composition IV for protective layer.

Polyvinyl alcohol (KH20 manufactured by The Nippon Synthetic Chemical industry Co., Ltd.; degree of saponification: 80%), plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol]; solid concentration: 85%) and NBR latex (SX 1503A manufactured by Nippon Zeon; solid concentration: 42%) were mixed in a ratio of 60/30/10 by weight to give a composition IV for protective layer.

Example 5

Hereinafter, the same evaluations as in Example 1 were conducted using a composition V for protective layer.

Polyvinyl alcohol (PVA 405 manufactured by Kuraray; degree of saponification: 82%), plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol]; solid concentration: 85%) and NBR latex (SX 1503A manufactured by Nippon Zeon; solid concentration: 42%) were mixed in a ratio of 40/40/20 by weight to give a composition V for protective layer.

Comparative Example 1

Hereinafter, the same evaluations as in Example 1 were conducted using a comparative composition I for protective layer.

Only polyvinyl alcohol (PVA 405 manufactured by Kuraray; degree of saponification: 82%) was used to give a comparative composition I for protective layer.

Comparative Example 2

Hereinafter, the same evaluations as in Example 1 were conducted using a comparative composition II for protective layer.

Polyvinyl alcohol (PVA 405 manufactured by Kuraray; degree of saponification: 82%) and plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol]; solid concentration: 85%) were mixed in a ratio of 60/40 by weight to give a comparative composition II for protective layer.

Comparative Example 3

Hereinafter, the same evaluations as in Example 1 were conducted using a comparative composition III for protective layer.

Polyvinyl alcohol (PVA 405 manufactured by Kuraray; degree of saponification: 82%) and plasticizer (glycerol) were mixed in a ratio of 60/40 by weight to give a comparative composition III for protective layer.

Comparative Example 4

Hereinafter, the same evaluations as in Example 1 were conducted using a comparative composition IV for protective layer.

Polyvinyl alcohol (PVA 405 manufactured by Kuraray; degree of saponification: 82%) and NBR latex (SX 1503A manufactured by Nippon Zeon; solid concentration: 42%) were mixed in a ratio of 70/30 by weight to give a composition IV for protective layer.

Comparative Example 5

Hereinafter, the same evaluations as in Example 5 were conducted using a comparative composition V for protective layer.

Polyvinyl alcohol (PVA 405 manufactured by Kuraray; degree of saponification: 82%), plasticizer (Sanflex SE 270 manufactured by Sanyo Chemical; polyether-polyol of an aliphatic polyhydric alcohol type [a modified product of hexane-1,2,3,4,5,6-hexaol with oxyethyleneol]; solid concentration: 85%) and NBR latex (SX 1503A manufactured by Nippon Zeon; solid concentration: 42%) were mixed in a ratio of 20/50/30 by weight to give a comparative composition V for protective layer.

Results of the evaluation are shown in Table 1. Incidentally, the data mentioned in the composition of Table 1 are the solid weights.

TABLE 1

| | | Example | | | | | Comparative Example | | | | |
|---|---|---|---|---|---|---|---|---|---|---|---|
| | | 1 | 2 | 3 | 4 | 5 | 1 | 2 | 3 | 4 | 5 |
| Composition of protective layer | PVA 405 | 50 | 50 | 70 | | 40 | 100 | 60 | 60 | 70 | 20 |
| | PVA (KH20) | | | | 60 | | | | | | |
| | Glycerol | | 30 | | | | | | 40 | | |
| | SE270 | 30 | | 20 | 30 | 40 | | 40 | | 30 | 50 |
| | Latex | 20 | 20 | 10 | 10 | 20 | | | | 30 | 30 |
| Results of evaluation | Wrinkle | O | Δ | O | O | O | X | O | O | X | O |
| | Damage due to laser | O | O | O | O | O | O | X | X | O | O |
| | Roughness of plate surface | O | O | O | O | O | O | O | O | O | X |

It will be apparent from Table 1 that, when a protective layer containing polyvinyl alcohol, plasticizer and water-dispersible latex was used, there was prepared an excellent printing plate having no wrinkle on the plate surface, no damage due to laser and no roughness on plate surface. It was noted that, when a polyether-polyol compound was used as a plasticizer, no damage due to laser was generated at all at any humidity. On the other hand, when polyvinyl alcohol was solely used in the protective layer as shown in Comparative Example 1, wrinkles were generated on the plate surface. When no latex was compounded as shown in Comparative Examples 2 and 3, damage due to laser was generated. When no plasticizer was compounded as shown in Comparative Example 4, wrinkles were generated on the plate surface. Further, when the compounding amount of polyvinyl alcohol was small as shown in Comparative Example 5, oxygen barrier property was insufficient and roughness was generated on the plate surface.

It is noted from the above results that, in a flexible flexographic printing original plate developable by water, an excellent printing plate having no defect can be prepared when a protective layer is compounded with the three components which are polyvinyl alcohol, plasticizer and water-dispersible latex in a predetermined rate.

INDUSTRIAL APPLICABILITY

Although the flexographic printing original plate of the present invention is flexible and developable by water, it hardly suffers from wrinkles and damage due to laser on the plate surface. Therefore, the flexographic printing original plate of the present invention is quite useful as a CTP plate which is photoengraved by means of a computer platemaking art.

The invention claimed is:

1. A photosensitive flexographic printing original plate developable by water, comprising:
   a supporting member,
   a photosentive resin layer,
   a protective layer, and
   a heat-sensitive mask layer;
   wherein at least the supporting member, the photosensitive resin layer, the protective layer and the heat-sensitive mask layer are successively laminated, and
   wherein, the protective layer contains (A) polyvinyl alcohol, (B) plasticizer and (C) water-dispersible latex in the following rate:
   Polyvinyl alcohol (A): 25 to 80 parts by weight
   Plasticizer (B): 15 to 60 parts by weight
   Water-dispersible latex (C): 5 to 40 parts by weight.

2. The flexographic printing original plate according to claim 1, wherein the plasticizer (B) is a polyether-polyol compound.

3. The flexographic printing original plate according to claim 1, wherein the plasticizer (B) has three or more hydroxyl groups in a molecule and has a molecular weight of 200 or more.

4. The flexographic printing original plate according to claim 2, wherein the plasticizer (B) has three or more hydroxyl groups in a molecule and has a molecular weight of 200 or more.

* * * * *